(12) United States Patent
Sasaoka et al.

(10) Patent No.: US 11,205,744 B2
(45) Date of Patent: Dec. 21, 2021

(54) LIGHT EMITTING DEVICE

(71) Applicant: NICHIA CORPORATION, Anan (JP)

(72) Inventors: Shimpei Sasaoka, Tokushima (JP);
Toshiyuki Hashimoto, Anan (JP);
Toshinobu Katsumata, Anan (JP);
Yoshihiro Sho, Anan (JP)

(73) Assignee: NICHIA CORPORATION, Anan (JP)

( * ) Notice: Subject to any disclaimer, the term of this patent is extended or adjusted under 35 U.S.C. 154(b) by 5 days.

(21) Appl. No.: 16/689,484

(22) Filed: Nov. 20, 2019

(65) Prior Publication Data

US 2020/0161516 A1 May 21, 2020

(30) Foreign Application Priority Data

Nov. 21, 2018 (JP) .............................. JP2018-217832
Nov. 14, 2019 (JP) .............................. JP2019-206389

(51) Int. Cl.
*H01L 33/58* (2010.01)
*H01L 25/075* (2006.01)
*H01L 33/50* (2010.01)
*G02B 5/18* (2006.01)

(52) U.S. Cl.
CPC ............ *H01L 33/58* (2013.01); *G02B 5/1876* (2013.01); *H01L 25/0753* (2013.01); *H01L 33/505* (2013.01)

(58) Field of Classification Search
CPC ... H01L 33/58; H01L 25/0753; H01L 33/505; H01L 33/507; H01L 33/60; H01L 33/486; H01L 2933/0091; G02B 5/1876; G02F 1/133606
See application file for complete search history.

(56) References Cited

U.S. PATENT DOCUMENTS

| 2006/0290627 A1 | 12/2006 | Konno et al. |
| 2013/0070165 A1 | 3/2013 | Shimizu |
| 2015/0316228 A1 | 11/2015 | Saito |
| 2018/0023784 A1 | 1/2018 | Tamura et al. |

(Continued)

FOREIGN PATENT DOCUMENTS

| JP | 2001-318614 A | 11/2001 |
| JP | 2004-342587 A | 12/2004 |

(Continued)

*Primary Examiner* — Mohammed R Alam
(74) *Attorney, Agent, or Firm* — Global IP Counselors, LLP

(57) ABSTRACT

A light emitting device includes a substrate, a demarcating member and a light-diffusing plate. The substrate has a plurality of light sources. The demarcating member includes a plurality of wall parts defining a plurality of compartments respectively corresponding to the light sources with each of the light sources being surrounded by corresponding ones of the wall parts defining a single compartment. Each of the wall parts include a ridge part and an inclined surface part. The light-diffusing plate is disposed above the light sources and having a plurality of first protrusions disposed on a first surface of the light-diffusing plate facing the substrate. Each of the first protrusions overlaps the inclined surface part of each of corresponding ones of the wall parts in a plan view. Each of the first protrusions surrounds a corresponding one of the light sources in the plan view.

16 Claims, 6 Drawing Sheets

(56) References Cited

U.S. PATENT DOCUMENTS

2019/0049651 A1* 2/2019 Yamamoto ................ F21S 2/00
2020/0343410 A1* 10/2020 Iguchi ..................... H01L 33/60

FOREIGN PATENT DOCUMENTS

| JP | 2007-003805 A | 1/2007 |
| JP | 2012-221779 A | 11/2012 |
| JP | 2015-212762 A | 11/2015 |
| JP | 2018-022683 A | 2/2018 |
| JP | 2018-056367 A | 4/2018 |
| JP | 2018-106970 A | 7/2018 |
| WO | 2011/158555 A1 | 12/2011 |
| WO | 2017/169123 A1 | 10/2017 |

* cited by examiner

LIGHT EMITTING DEVICE

CROSS-REFERENCE TO RELATED PATENT APPLICATION

This application claims priority under 35 U.S.C. § 119 to Japanese Patent Application No. 2018-217832, filed Nov. 21, 2018 and Japanese Patent Application No. 2019-206389 filed on Nov. 14, 2019. The entire disclosures of Japanese Patent Application No 2018-217832 and 2019-206389 are hereby incorporated herein by reference.

BACKGROUND

Technical Field

The present disclosure relates to a light emitting device.

Description of Related Art

For direct-type backlights for applications such as a liquid crystal television, surface light-emitting devices have been known. One example of such a surface light-emitting device described in Japanese Unexamined Patent Application Publication No. 2012-221779 has a plurality of light sources arranged in a matrix, and a diffusion plate with integrally formed convex parts protruded in a curved surface shape above the plurality of light sources. Accordingly, when the light emitting device is viewed from the light extracting surface side, generation of unevenness of illuminance can be efficiently restrained.

SUMMARY OF THE INVENTION

When local-dimming of the light sources is performed in such a light emitting device, light emitted from the light sources disposed in a light-emitting area and diffused in the diffusing plate etc., and propagates in the diffusing plate etc., may enter a non-lighting area adjacent to the light-emitting area, resulting in a reduction in contrast ratio. Also, when viewed from the display surface side of the surface light-emitting device, sufficient reduction of luminance unevenness has not yet been achieved, a measure to obtain further uniform surface emission has been required.

The present disclosure is directed in view of the disadvantages described above, and is aimed to provide a light emitting device which allows efficient reduction in luminance unevenness and further enhancement of contrast ratio between the light-emitting areas and non-lighting areas.

The embodiments include the aspects described below.

A light emitting device includes a substrate, a demarcating member and a light-diffusing plate. The substrate has a plurality of light sources. The demarcating member includes a plurality of wall parts defining a plurality of compartments respectively corresponding to the light sources with each of the light sources being surrounded by corresponding ones of the wall parts defining a single compartment. Each of the wall parts include a ridge part and an inclined surface part. The light-diffusing plate is disposed above the light sources and having a plurality of first protrusions disposed on a first surface of the light-diffusing plate facing the substrate. Each of the first protrusions overlaps the inclined surface part of each of corresponding ones of the wall parts in a plan view. Each of the first protrusions surrounds a corresponding one of the light sources in the plan view.

A light emitting device according to one embodiment of the present disclosure allows efficient reduction in luminance unevenness and further enhancement of contrast ratio between the light-emitting areas and non-lighting areas.

DETAILED DESCRIPTION OF EMBODIMENTS

Figure 1A:
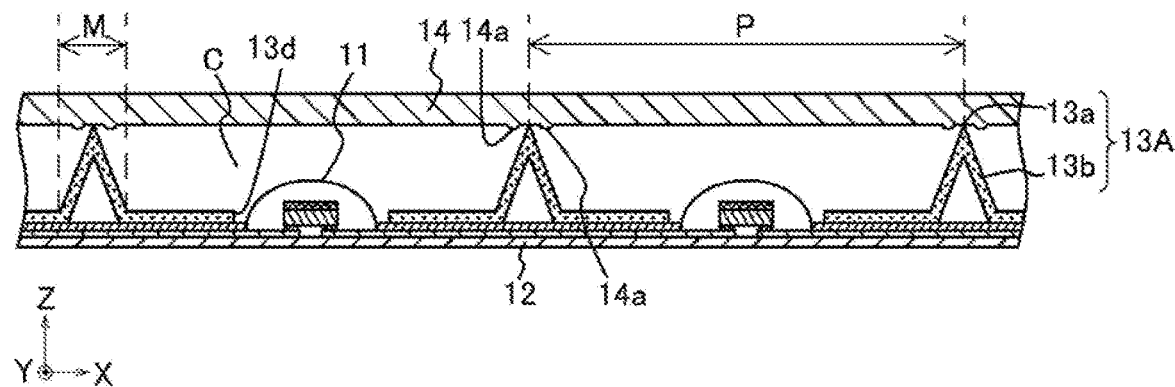
FIG. 1A is a schematic sectional view of a light emitting device according to one embodiment of the present invention.

Certain embodiments according to the present disclosure will be described below with reference to the accompanying drawings. It is to be noted that the light emitting device described below is intended for implementing the technical concept of the present invention, and the present invention is not limited to those described below unless otherwise specified. Description given in one example and one embodiment can also be applied in other examples embodiments of embodiments. Note that, the size, positional relationship and the like in the drawings may be exaggerated for the sake of clarity.

In the embodiments described below, a light extracting surface of a light source may be referred to as an "upper surface", and a light extracting surface side may be referred to as an "upper side".

Figure 1B:
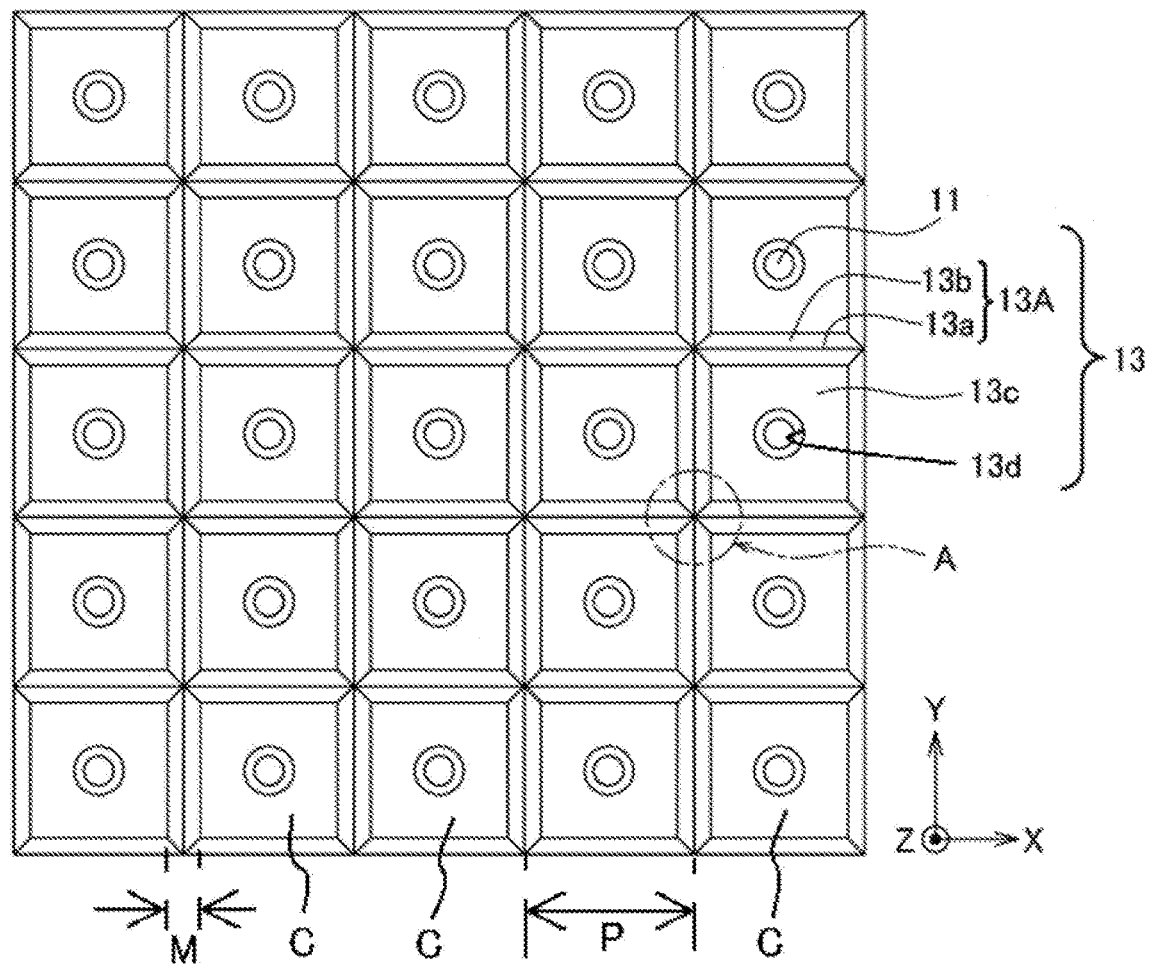
FIG. 1B is a schematic plan view of the light emitting device shown in FIG. 1A.

A light emitting device according to one embodiment of the present invention includes, as shown in FIG. 1A and FIG. 1B, a plurality of light sources 11, a substrate 12, a demarcating member 13, and a light-diffusing plate 14. The plurality of light sources 11 are arranged on the substrate member 12. The demarcating member 13 includes a plurality of wall parts 13A surrounding each of the light sources 11, in which each of the wall parts 13A includes a ridge part 13a and an inclined surface part 13b. An area (i.e., a region and a space) surrounded by the wall parts 13A including respective ridge parts 13a is determined as a single compartment C, and the demarcating member 13 defines a plurality of compartments C. The light-diffusing plate 14 is disposed above the plurality of light sources 11 and has a plurality of first protrusions 14a on a first surface that is a surface facing the substrate 12. Each of the first protrusions 14a is formed in a region M that overlaps the inclined surface parts 13b in a plan view, and is disposed to surround each of the light sources 11. The light emitting device is a surface-emitting type light emitting device.

Light emitted from the light source 11 is irradiated on the inclined surface parts 13b of the demarcating member 13 and is reflected and condenses at a region M of the light-diffusing plate. In the configuration described above, each of the first protrusions 14a is disposed on the light-diffusing plate 14 in the region M that overlaps the inclined surface parts 13b in a plan view, such that light condenses at the region can be efficiently dispersed. Accordingly, when the light emitting device is viewed from the light extracting surface side, uneven luminance can be efficiently reduced. The demarcating member 13 is disposed at an appropriate location such that light emitted from each of the light sources 11 can be prevented from entering adjacent regions, or entering of light to adjacent regions can be reduced. As a result, the contrast ratio can be further improved when the adjacent region is unlit.

Light Source 11

The light sources 11 are members configured to emit light, and include, for example, light emitting elements that are configured to produce light, light emitting element(s) enclosed by a light-transmissive resin or the like, and a packaged surface-mounting type light emitting device.

Figure 1C:
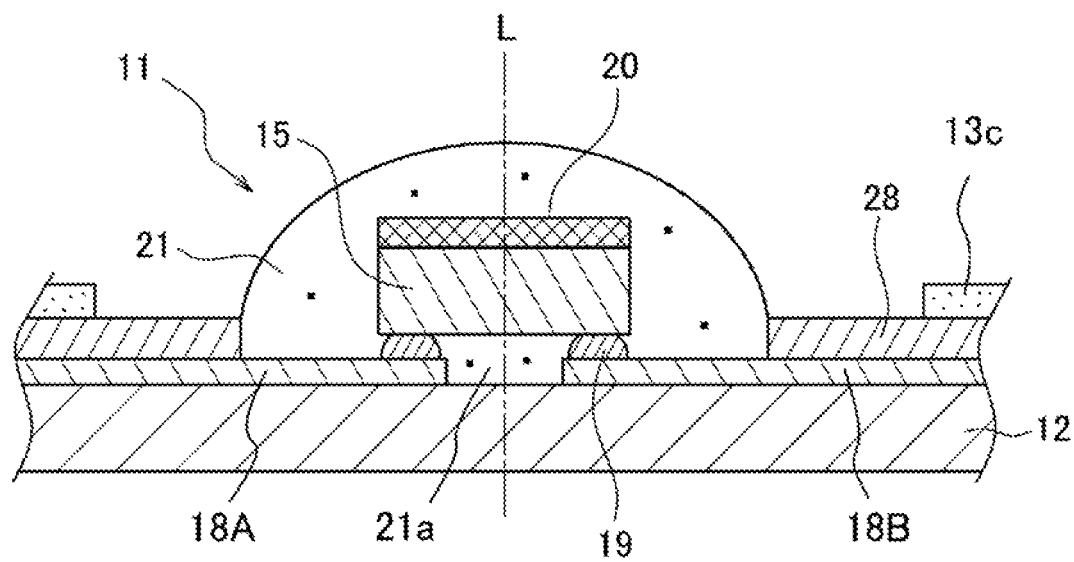
FIG. 1C is a partially enlarged schematic cross-sectional view showing a vicinity of a light emitting element of the light emitting device shown in FIG. 1A.

For example, as shown in FIG. 1C, the light source 11 including a light emitting element 15 covered by a sealing member 21 can be employed. A single light source may include a single light emitting element 15 as shown above, but also may include a plurality of light emitting elements.

The light source 11 of any appropriate light distributing properties can be employed, but for example, when the light source 11 is surrounded by the wall part 13A of the demarcating member 13 to be described later in the specification, the light source 20 preferably has a wide light distribution such that emission of light with a small difference in brightness can be achieved at each compartment C surrounded by the wall part 13A. In particular, each of the light sources 11 preferably produces a batwing light distribution. This allows for a reduction in the amount of light emitted in a perpendicularly upward direction relative to the light sources 11, which allows for expansion of distribution of light of each of the light sources 11. The expanded light is irradiated on the wall part 13A and the bottom surface part 13c and is reflected, and thus unevenness in brightness in each of the compartments C surrounded by the wall part 13A can be reduced or substantially eliminated.

The term "batwing light distribution" used herein can be defined as an emission intensity distribution exhibiting stronger emission intensities at angles with absolute values of light distribution angle greater than zero at 0°, with respect to the optical axis L at 0°. The optical axis L can be defined as a line (as shown in FIG. 1C) passing through the center of the light source 11 and perpendicular to a line in the plane of the substrate 12 to be described further below.

In particular, the light source 11 configured to produce a batwing light distribution may have a light emitting element 15 having a light-reflecting film 20 on its upper surface as shown in FIG. 1C. Accordingly, light in upward direction emitted from the light emitting element 15 is reflected at the light-reflecting film 20 such that the amount of light directly above the light emitting element 15 is reduced to produce a batwing light distribution. The light-reflecting film 20 can be disposed directly on the upper surface of the light emitting element 15, which can eliminate the need for a specific lens for obtaining batwing light distribution, thus allowing a reduction in the thickness of the light source 11.

The light-reflecting film 20 disposed on the upper surface of the light emitting element 15 may be a metal film of silver, copper, or the like, a dielectric multilayer film (DBR film), or a combination of the both. The light-reflecting film 20 preferably has an associated reflectivity that exhibits angle dependence on the incidence angle to the emission wavelength of the light emitting element 15. More specifically, the light reflecting film 20 preferably has a reflectance smaller to oblique incident light than to perpendicularly incident light. With this arrangement, a gradual change in the luminance can be obtained directly above the light emitting element and accordingly, occurrence of undesirable darker portion, such as occurrence of perceivably darker portion directly above the light emitting element can be prevented or reduced.

The light sources 11 respectively include, for example, one or more of the light emitting elements 15 each having a height in a range of 100 μm to 500 μm when directly mounted on the substrate 12. The light-reflecting film 20 has a thickness of, for example, in a range of 0.1 μm to 3.0 μm. Accordingly, even including the sealing member 21 to be discussed later in the specification, the thickness of the light sources 11 can be in a range of about 0.5 to about 2.0 mm.

It is preferable that the plurality of light sources 11 are mounted on the substrate 12 to be discussed later in the specification such that each of the plurality of light sources 11 can be operated discretely, and that illumination control (for example, local dimming or HDR) can be carried out at each of the plurality of light sources 11.

Light Emitting Element 15

For the light emitting element 15, any appropriate light emitting element known in the art can be used. For example, a light emitting diode is preferably used as the light emitting element 15. The light emitting element 15 of any desired wavelength can be employed. For example, a light emitting element for emitting light of a blue color or a green color, a nitride-based semiconductor can be used. For a light emitting element for emitting light of a red color, GaAlAs, AlInGaP, etc., can be used. Semiconductor light emitting elements made of materials other than those described above may also be used. The composition, the color of emitting light, the size and the number of light emitting elements can be selected appropriately, according to the purpose and application.

As shown in FIG. 1C, the light emitting element 15 can be flip-chip mounted, in which the light emitting element 15 is straddling the positive and negative electrically conductive wiring 18A and 18B disposed on the upper surface of the substrate 12, via the respective bonding members 19. The light emitting element 15 may be mounted in a flip-chip manner or a face-up manner. The bonding member 19 is configured to secure the light emitting element 15 to the substrate or to the electrically conductive wirings and for example, made of an insulating resin, an electrically conductive material, or the like. When the light emitting element 15 is flip-chip mounted on the substrate 12, an electrically conductive bonding member 19 is used. Specific examples of such a material include an Au-containing alloy, an Ag-containing alloy, a Pd-containing alloy, an In-containing alloy, a Pd—Pd containing alloy, an Au—Ga containing alloy, an Au—Sn containing alloy, a Sn containing alloy, a Sn—Cu containing alloy, a Sn—Cu—Ag containing alloy, an Au—Ge containing alloy, an Au—Si containing alloy, an Al-containing alloy, a Cu—In containing alloy, and a mixture of a metal and a flux.

Sealing Member 21

The sealing member 21 is disposed to cover the light emitting element 15 to protect the light emitting element 15 from external environment and also to, for example, optically control the light emitted from the light emitting element 15. The sealing member 21 is made of a light-transmissive material. Examples of the materials of the sealing member 21 include light-transmissive resin such as epoxy resin, silicone resin, resins which are mixtures of those, and glass. In view of light-resisting properties and ease of molding, silicone resin is preferably used. The sealing member 21 may contain a wavelength converting material such as a fluorescent material configured to absorb light from the light emitting element 15 and emit light of different wavelength than that of light emitted from the light emitting element 15, a light-diffusion agent configured to diffuse light from the light emitting element 15, and/or a coloring agent corresponding to the color of light emitted from the light emitting element 15.

For the fluorescent material, the light diffusion agent, and the coloring agent, any appropriate known materials in the art can be used.

The sealing member 21 may be in direct contact with the substrate 12.

The sealing member 21 may be disposed such that a viscosity of the material is adjusted for printing, dispenser printing, or the like, and applied, then, hardened by using heat treatment, light-irradiation, or the like. The sealing member 21 can be formed in a shape, for example, a substantially hemispherical shape, an elongated dome shape (a length in Z-direction is larger than a length in X-direction) in a cross-sectional view, a flat dome shape (a length in X-direction is larger than a length in Z-direction) in a cross-sectional view, or a circular or elliptical shape in a top plan view.

The sealing members 21 may also be disposed as an underfill 21a between the lower surface of the light emitting element 15 and the upper surface of the substrate 12.

Substrate 12

The substrate 12 is configured to mount a plurality of light sources 11 thereon, and as shown in FIG. 1C, has electrically conductive wirings 18A and 18B on the upper surface of the substrate 12 to supply electric power to the light sources 11 such as the light emitting elements 15. Of the electrically conductive wirings 18A and 18B, regions that are not used to establish electrical connection are preferably covered by a covering member 28.

The substrate 12 is made of a material that can insulatingly separate the electrically conductive wirings 18A and 18B. Examples of the material of the substrate 12 include ceramics, resin, and composite materials. Examples of the ceramics include alumina, mullite, forsterite, glass ceramics, nitride-based ceramics (for example, AlN), carbide-based ceramics (for example, SiC), and LTCC. Examples of the resin include phenol resin, epoxy resin, polyimide resin, BT resin, polyphthalamide (PPA), and polyethylene terephthalate (PET). Examples of the composite materials include the resins described above having an inorganic filler such as glass fiber, $SiO_2$, $TiO_2$, or $Al_2O_3$ mixed therein, and glass fiber reinforced resin (glass epoxy resin), and a metal substrate including a metal member with an insulating layer formed thereon.

The substrate 12 can have an appropriate thickness, and either a flexible substrate that can be manufactured by, for example, a roll-to-roll processing, or a rigid substrate can be used. The rigid substrate may be a thin-type bendable rigid substrate.

The electrically conductive wirings 18A and 18B are made of any appropriate electrically conductive material, and generally a material used for wiring layer of a circuit substrate, or the like, can be used. The surface of the electrically conductive wirings may be provided with a plated film, a light-reflecting film, or the like.

The covering member 28 is preferably made of an insulating material. Examples of the insulating materials include the materials similar to those illustrated for the substrate. When resin containing a white filler or the like, as described above is used for the covering member, leakage and absorption of light can be reduced or prevented, and the light extraction efficiency of the light emitting device can be improved.

Demarcating Member 13

Figure 1D:
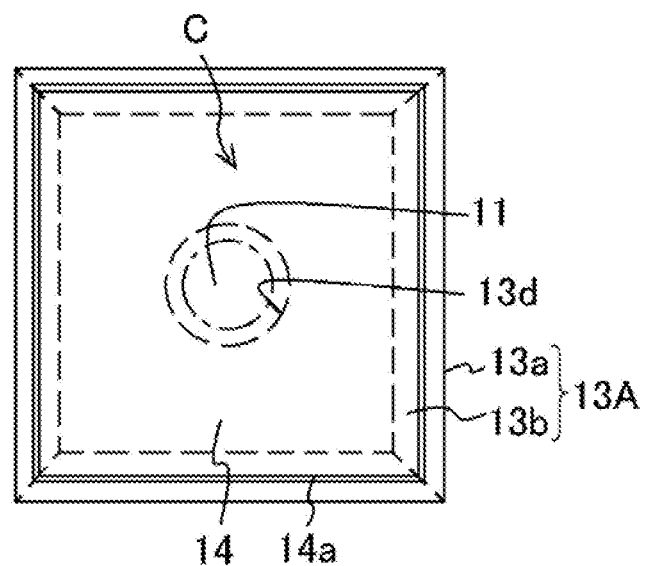
FIG. 1D is a schematic plan view for illustrating a positional relationship between a light-diffusing plate and a demarcating member in a single demarcated part of the light emitting device shown in FIG. 1A.

As shown in FIGS. 1A, 1B, and 1D etc., the demarcating member 13 includes a plurality of wall parts 13A surrounding each of the light sources 11, in which each of the wall parts 13A includes a ridge part 13a and an inclined surface part 13b. An area (i.e., a region and a space) surrounded by portions of the wall part 13A is determined as a single compartment C, and the demarcating member 13 defines a plurality of compartments C. In a plan view, the ridge part 13a can be regarded as a border between adjacent compartments C.

The demarcating member 13 preferably has a bottom surface part 13c in each of the compartments C. In other words, the demarcated member 13 demarcates each compartment C with the bottom surface part 13c and the wall part 13A. The bottom surface part 13c in each of the compartments C defines a through-hole 13d at a substantially center of the bottom surface part 13c. As shown in FIG. 1A etc., the light source 11 is disposed in each of the through holes 13d. The shape and size of the through holes 13d can be determined to expose the entire of respective corresponding light source 11 such that a periphery defining each of the through-holes 13d is preferably located proximate to the outer periphery of the corresponding light source 11. With this arrangement, when the demarcating member 13 has light-reflecting property, light from the light source 11 can also be reflected at the bottom surface part 13c, which can also improve the light extraction efficiency.

The ridge part 13a is the highest part of the wall part 13A and formed by the intersection of at least two inclined parts of the wall parts 13A surrounding adjacent compartments C. The ridge part may have a flat surface, but preferably has a sharp edge. That is, as shown in, FIG. 1A etc., a longitudinal section of a shape formed with two wall parts 13A that form a ridge part 13a is preferably an acute-angled triangle, more preferably an acute-angled isosceles triangle. The acute-angled vertex (α in FIG. 1E) of an acute-angled triangle or an acute-angled isosceles triangle where two sides meet is preferably in a range of 30° or more and less than 90°. With this range of angle, the space and region occupied by the demarcating member 13 can be reduced, and the height (OD in FIG. 1E) of the demarcating member 13 can be reduced, such that the size and height of the light emitting device can be reduced.

The pitch P between successive vertexes 13a of the demarcating member 13 can be adjusted according to the size, performance, etc., designed for the light emitting device. For example, the pitch P can be in a range of 1 to 50 mm, preferably in a range of 5 to 20 mm, more preferably in a range of 6 to 15 mm.

Figure 4:
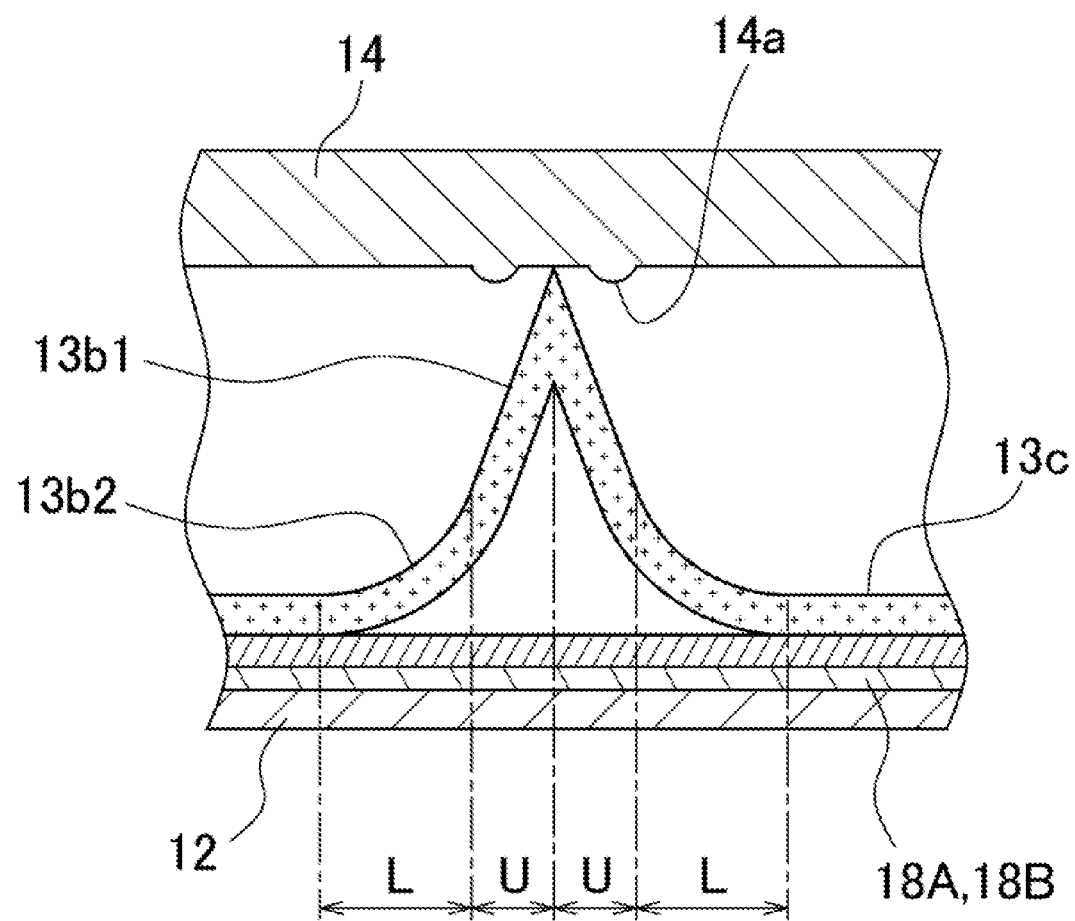
FIG. 4 is a partially enlarged schematic cross-sectional view showing a vicinity of another example of the wall part of the demarcating member of the light emitting device shown in FIG. 1A.

The inclined surface parts 13b of the wall parts 13A surrounding each of the light sources 11 are preferably configured to widen the compartment C from the bottom surface part 13c upward. For example, the angle ($\gamma$ in FIG. 1E) of the wall part 13A can be in a range of 45 to 60°. As shown in FIG. 4, the inclined surface parts may respectively have an upper inclined surface part 13b1 (U) and a lower inclined surface part 13b2 (L) having different inclination angles, arranged in an up-down direction. The inclination angles of the inclined surface parts can be adjusted appropriately in the range shown above. For example, the inclination angle of the upper inclined surface part 13b1 (an angle corresponding to $\gamma$ in FIG. 1E) may be smaller than the inclination angle of the lower inclined surface part 13b2, the inclination angle of the upper inclined surface part 13b1 is preferably larger than the inclination angle of the lower inclined surface part 13b2, as shown in FIG. 4.

The height (OD in FIG. 1E) of the demarcating member 13, in other words, the length between the lower surface of the bottom surface part 13c and the ridge part 13a is preferably 8 mm or less, and for the light emitting device of a smaller height, preferably in a range of about 1 to about 4 mm, the length between the lower surface of the bottom surface part 13a and the upper surface of the light-diffusing plate 14 is preferably about 8 mm or less, and for the light emitting device of a smaller height, in a range of about 2 to about 4 mm. With this arrangement, the height of the backlight unit including the optical members such as the light-diffusing plate 14 can be made very small.

The thickness of the demarcating member 13 may be constant or may vary depending on the part, the demarcating member 13 constituting the upper inclined surface part 13b1 is preferably smaller in thickness than the demarcating member 13 constituting the lower inclined surface part 13b2. For example, the thickness of the demarcating member 13 may be, for example, in a range of 100 μm to 300 μm.

The respective one of the compartments C surrounded by corresponding parts of the demarcating member 13 that surrounds the light source 11, in other words, each of the regions demarcated by the wall parts 13A has, for example, a circular shape, an elliptic shape, or the like in a plan view, but in order to efficiently dispose the plurality of light sources 11, a polygonal shape such as a triangular shape, a quadrangular shape, a hexagonal shape, or the like, is preferable. This can facilitate demarcating the light-emitting area with any appropriate number of the wall parts 13A according to the area of the light-emitting surface of the surface light-emitting device. The number of the compartments C demarcated by the wall parts 13A can be determined appropriately. The shape and arrangement of the wall parts 13A and the number of the components C or the like, can be adjusted according to the desired size (dimensions) of the light emitting device.

The demarcating member 13 can be formed in various shapes according to the number and locations of the light sources 11 arranged on the substrate 12. For example, ends of the ridge parts 13a of adjacent three components C meet at one point, ends of the ridge parts 13a of adjacent four components C meet at one point (as shown as A in FIG. 1B), ends of the ridge parts 13a of adjacent six components C meet at one point, or the like.

The demarcating member 13 is preferably arranged above the substrate 12, and the lower surfaces of the bottom surface parts 13a of the demarcating member 13 and the upper surface of the substrate 12 are preferably secured to each other. In particular, it is preferable that the periphery of each of the through-holes 13d is secured by a light-reflecting adhesive member such that light emitted from each of the light sources 11 does not enter between the substrate 12 and the demarcated member 13. For example, the light-reflecting adhesive member is more preferably disposed in a ring shape along the periphery of each of the through-holes 13d. The adhesive member may be a double-sided adhesive tape, a hot-melt-type adhesive sheet, a thermosetting resin-based adhesive, or a thermoplastic resin-based adhesive. The adhesive member described above preferably have high flame retardancy. Alternatively, the demarcating member 13 may be secured onto the substrate 12 by screws or the like.

The demarcating member 13 preferably has light-reflecting properties. Accordingly, light emitted from each of the light sources 11 can be efficiently reflected at the wall parts 13A and the bottom surface part 13c of corresponding compartment C. In particular, when the wall parts 13A have inclined surface parts as described above, light emitted from each of the light sources 11 is irradiated on the corresponding wall parts 13A and can be reflected upward. As a result, the contrast ratio can be further improved when the adjacent compartment C is unlit. Further, light can be efficiently reflected in an upward direction.

The demarcating member 13 may be formed using a resin material containing a light-reflecting material made of metal oxide particles such as titanium oxide, aluminum oxide, or silicon oxide, or may be formed using a resin material that does not contain a light-reflecting material, and subsequently applying a light-reflecting material on its surfaces. It is preferable that 70% or greater reflectance to light emitted from the light sources 11 can be satisfied.

The demarcating member 13 can be formed by using, for example, a die molding method or an optical molding method. Examples of die molding methods include injection molding, extrusion molding, compression molding, vacuum forming, pressure forming, and press forming. For example, the demarcating member 13 having integrally formed bottom surface parts 13c and wall parts 13A can be formed through vacuum molding using a reflecting sheet made of PET or the like.

The demarcating member 13 includes a plurality of compartments C arranged in a row direction and a column direction, or in a matrix. For example, the demarcating member 13 can be configured as shown in FIG. 1B, in which a total of 25 light sources 11 are arranged on a substrate in a matrix of five in the X direction and five in the Y direction, 25 compartments C each having the wall parts 13A surrounding each of the light sources 11 and having a substantially square shape in a top view, and a through-hole 13d for mounting a light source 11 is defined at a substantially the center of the bottom surface part 13c of each of the compartments C.

Light-Diffusing Plate 14

The light-diffusing plate 14 is configured to allow incident light to transmit therethrough while being diffused, and a single light-diffusing plate 14 is preferably disposed above the plurality of light sources 11. The light-diffusing plate 14 has a plurality of first protrusions 14a on a first surface facing the substrate 12. Each of the first protrusions 14a is formed in a region M that overlaps the inclined surface parts 13b to surround each of the light sources 11 in a plan view. As described above, when the inclined surface parts 13b respectively have the upper inclined surface part and the lower inclined surface part, each of the first protrusions 14a is formed in a region that overlaps the upper inclined surface part in a plan view. In other words, the respective one of the first protrusions 14a may be disposed in a center of the region M overlapping the inclined surface parts 13b to surround the light source 11 in a plan view, but preferably disposed closer to the corresponding ridge parts 13a. In the present specification, the expression "surrounding" refers to continuously and completely surrounding each of the light sources 11, or refers to a plurality of separate parts discontinuously or intermittently surrounding each of the light sources 11.

When the shape of each of the components C, that is, the shape of the region demarcated by the wall parts 13A is a polygonal shape such as a triangular shape, a quadrangular shape, a hexagonal shape, or the like in a plan view, the first protrusion 14a is preferably formed in a shape along the peripheral shape of the compartment C. For example, as shown in FIG. 1B, when the wall parts 13A forming a single demarcation in a plan view is disposed in a quadrangular shape surrounding the light source 11, the first protrusion 14a can be disposed in a continuous quadrangular ring shape or a quadrangular ring shape formed with a plurality of separate parts.

The first protrusion 14a can have a height (or thickness, T in FIG. 1E) as measured from a surface of the light-diffusing plate in a range of 5 to 30%, preferably in a range of 9 to 20% with respect to a minimum thickness (for example, t in FIG. 1E) of the light-diffusing plate corresponding to a single demarcation. The first protrusion 14a can have a width (W in FIG. 1E) in a range of 10 to 90%, preferably in a range of 20 to 70%, with respect to the width of the region M. For example, in a single compartment C, the light-diffusing plate 14 has a minimum thickness t in a range of 0.2 to 5 mm, preferably in a range of 0.5 to 2 mm, the first protrusion 14a has a height T in a range of 0.05 to 2 mm, preferably in a range of 0.1 to 0.6 mm, and has a width W in a range of 0.1 to 1 mm, preferably in a range of 0.2 to 0.7 mm.

Figure 1E:
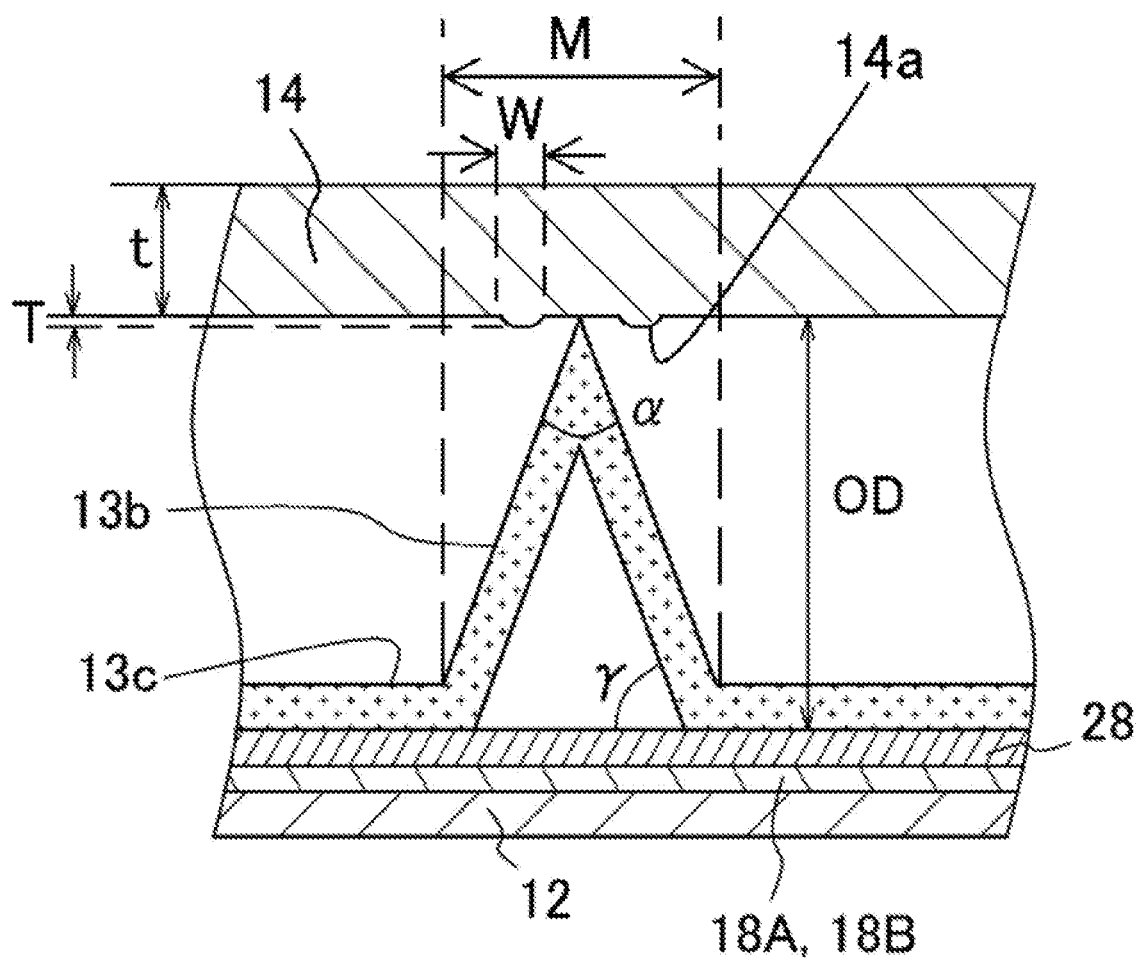
FIG. 1E is a partially enlarged schematic cross-sectional view showing a vicinity of a wall part of the demarcating member of the light emitting device shown in FIG. 1A.

The first protrusions 14a can be formed in an any appropriate shape such as a dome shape, a semicylindrical shape, a pillar shape, or a truncated shape, but for example, preferably formed in a shape with a symmetric cross section along a longitudinal center line of the first protrusions 14a, more preferably in a symmetric dome shape as shown in FIG. 1E etc.

The light-diffusing plate 14 is preferably located substantially in parallel to the substrate 12. For example, the light-diffusing plate 14 may have uneven surface at the light extracting surface side, but the surface is preferably flat, further preferably the flat surface is substantially in parallel to the substrate 12. The height differential of the uneven surface may be, for example, 0.01 to 0.1 mm. Incident light can be diffused by the uneven structure.

The light-diffusing plate 14 can be formed with a material that hardly absorb visible light, such as polycarbonate resin, polystyrene resin, acrylic resin, polyethylene resin, or the like. In order to diffuse incident light, materials having different refractive indices may be dispersed in the light-diffusing plate 14.

Examples of the materials having different refractive indices include polycarbonate resin, acrylic resin, or the like.

The thickness of the light-diffusing plate 14 and the degree of diffusion of light can be appropriately set, and a light-diffusing sheet, a light-diffusing film, or the like, a material available in the market can be employed.

Figure 2A:
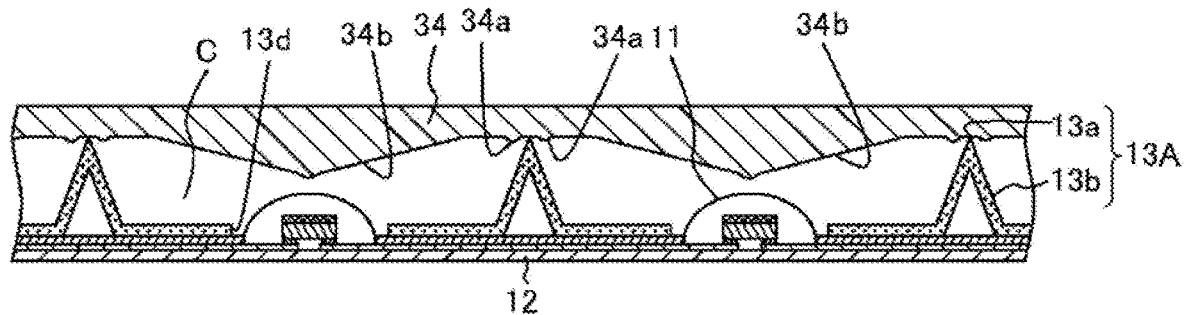
FIG. 2A is a schematic cross-sectional view of a light emitting device of another embodiment of the present invention.
Figure 2B:
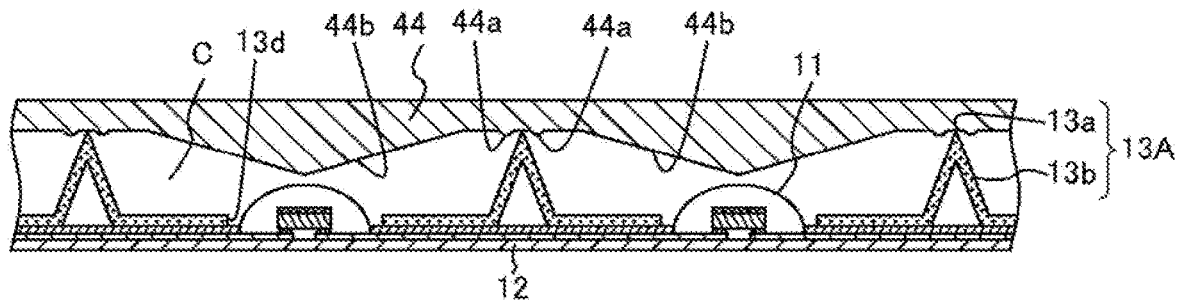
FIG. 2B is a schematic cross-sectional view showing a light emitting device of further embodiment of the present invention.
Figure 2C:
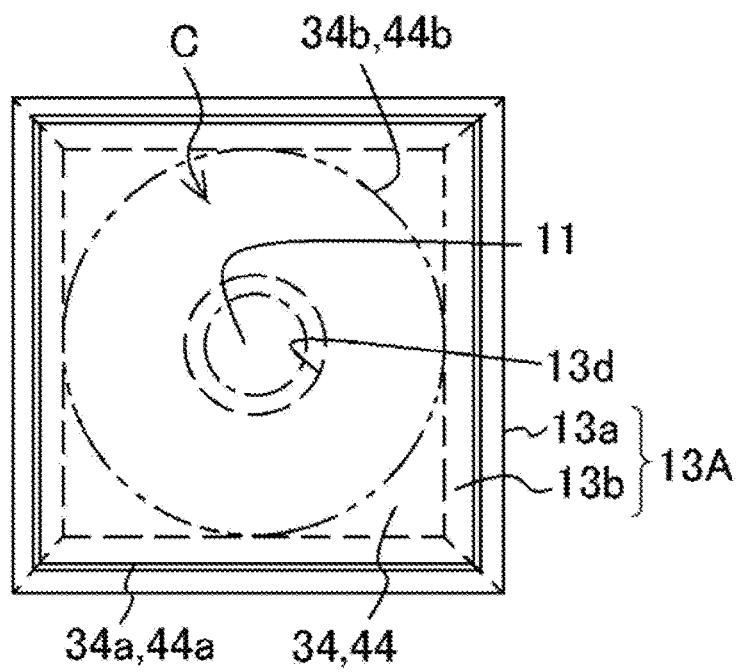
FIG. 2C is a schematic plan view for illustrating a positional relationship between a light-diffusing plate and a demarcating member in a single demarcated part of the light emitting devices shown in FIG. 2A and FIG. 2B.
Figure 2D:
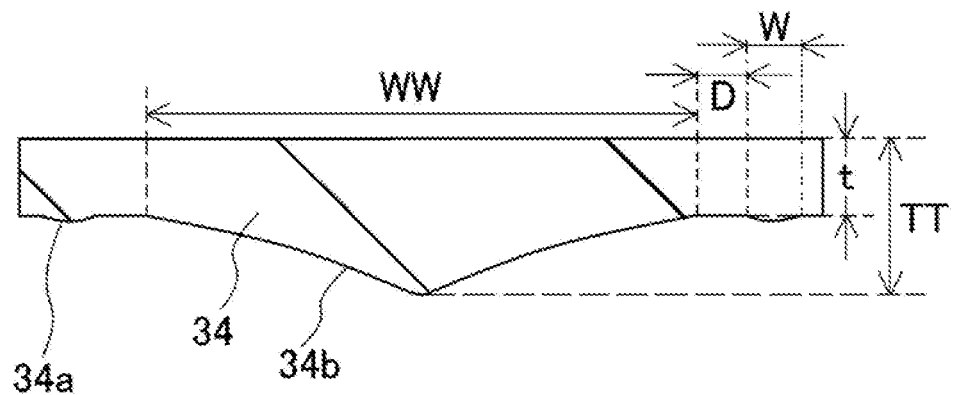
FIG. 2D is a partially enlarged schematic cross-sectional view of a light-diffusing plate of the light emitting device shown in FIG. 2A.

For example, as shown in FIG. 2A to FIG. 2D, the light-diffusing plates 34 and 44 may have respective second protrusions 34b and 44b in respective regions overlapping with the respective light sources 11 in a plan view, in addition to the respective first protrusions 34a and 44a. In a respective plan view, the second protrusions 34b and 44b are respectively disposed in respective regions only overlapping with the respective light sources 11, or with shapes respectively corresponding to respective light sources 11, or the second protrusions 34b and 44b are respectively disposed in respective regions overlapping with the respective light sources 11, with the same shape and different size centering the regions overlapping with the respective light sources 11. The second protrusions 34b and 44b respectively have shapes, for example, circular shapes, polygonal shapes, or rounded polygonal shapes, in plan view. The outer peripheries of the second protrusions 34b and 44b are respectively located surrounding the respective light sources 11 in plan view, for example, with areas of 110% or greater, with respect to the areas of the respective light sources 11 as 100%. The outer peripheries of the second protrusions 34b and 44b are respectively spaced apart from the respective first protrusions 34a and 44a. In particular, it is preferable that the second protrusions 34b and 44b have shapes the same and different dimensions as the shapes of the respective regions overlapping with the respective light sources 11, in which respective regions overlapping with the respective light sources 11 are located at respective centers, and that the greater the separation from the first protrusions 34a and 44a within the distance D, the closer the portions of the second protrusions 34b and 44b to the first protrusions 34a and 44a, and as shown in FIG. 2C, the outer peripheries of the second protrusions 34b and 44b preferably have circular shapes respectively. For example, the second protrusions 34b and 44b may respectively have diameters in plan view (WW in FIG. 2D) in a range of 10 to 80%, preferably in a range of 30 to 70% with respect to the pitch P. More specifically, the diameters of the second protrusions 34b and 44b may respectively in a range of 0.3 to 35 mm, preferably 1.5 to 15 mm, more preferably in a range of 1.8 to 10 mm. The distance D can be, for example, in a range of 0 to 4 mm, preferably in a range of 1 to 3 mm.

The second protrusions 34b and 44b preferably respectively have thicknesses greatest in a region overlapping with the respective light sources 11, and more preferably respectively have thickness greatest at locations directly above the centers of respective light sources 11. The second protrusions 34b and 44b can respectively formed in any appropriate shapes, for example, a dome shape, a cone shape, a truncated shape, or a pillar shape. Of those, a cone shape or a truncated shape is preferable, as allowing thicknesses greatest at portions corresponding to the centers or substantially the centers of the respective light sources 11. In this case, portions of the surfaces of the second protrusions 34b and 44b corresponding to the centers or substantially centers of the respective light sources 11 toward the outer peripheries of the second protrusions 34b and 44b may be curves protruding toward the substrate 12 side in a cross-sectional view, may be curves depressed toward the light extracting surface side in a cross-sectional view (34b in FIG. 2A and FIG. 2D), or straight line segments as shown in FIG. 2B (44b in FIG. 2B). Further, the second protrusions 34b and 44b preferably have cross-sectional shapes that are symmetrical with respect lines passing through portions with the largest thicknesses.

At portions of the second protrusions 34b and 44b having the largest thicknesses, the light-diffusing plates 33 and 34 can respectively have maximum thicknesses (for example, TT in FIG. 2D) in a range of 200 to 600%, more preferably in a range of 400 to 600% with respect to the thicknesses at portions having the minimum thicknesses (for example, t in FIG. 1E and FIG. 2D) in a single demarcation. From another point of view, at portions of the second protrusions 34b and 44b having the maximum thicknesses, the light-diffusing plates 33 and 34 can respectively have thicknesses (for example, TT in FIG. 2D) in a range of 2 to 5 mm, preferably in a range of 2 to 3.5 mm.

Other Component Members

The light emitting device according to the present embodiment may be provided with a light-reflecting member, or the like.

Light-Reflecting Member

Figure 3A:
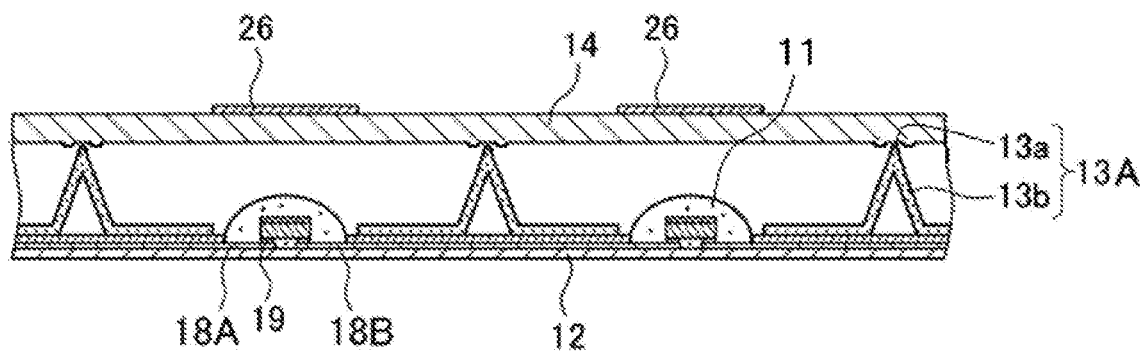
FIG. 3A is a schematic cross-sectional view of a light emitting device of yet another embodiment of the present invention.
Figure 3B:
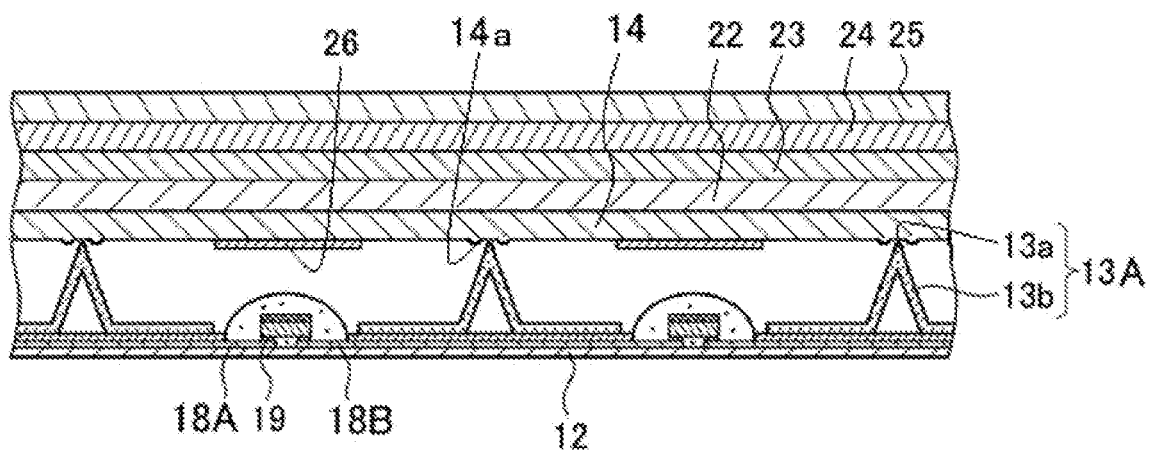
FIG. 3B is a schematic cross-sectional view showing a light emitting device of still another embodiment of the present invention.

A light-reflecting member 26 may be disposed on an upper surface (second surface) of the light-diffusing plate 14, for example, at locations above each of the light sources 11, preferably at locations directly above each of the light sources as shown in FIG. 3A. As shown in FIG. 3B, the light-reflecting member 26 may be disposed on a lower surface (first surface) of the light-diffusing plate 14, facing the substrate 12. The distance between the light-diffusing plate 14 and each of the light sources 11 is smallest in regions above the light sources 11, particularly in regions directly above the light sources 11. Accordingly, such regions have high luminance. The smaller the distance between the light-diffusing plate 14 and the respective one of the light sources 11, the greater luminance unevenness between regions above (directly above) the respective light sources 11 and regions directly above regions where the light sources 11 are not disposed. For this reason, disposing the light-reflecting members on the upper or lower surface of the light-diffusing plate 14 as described above, portion of light with high directivity emitted from the light sources 11 can be reflected at the light-reflecting members 26 and returned toward the light sources 11.

The light-reflecting members 26 can be formed with a material containing a light-reflecting material, such as a resin and/or an organic solvent, containing a light-reflecting material. Examples of light-reflecting material include particles of metal oxide such as titanium oxide, aluminum oxide, and silicon oxide. The resin and the organic solvent can be appropriately selected in view of the metal oxide particles and characteristics required for the light emitting device in its application. A preferable resin can be a light-transmissive photocurable resin, mainly containing an acrylate resin, an epoxy resin, or the like.

The material of the light-reflecting members 26 may further contain, for example, a pigment, a light-absorbing material, and/or a fluorescent material.

The light-reflecting members 26 are disposed in a predetermined shape such as stripes, islands, or other various shapes, or in a pattern. The light-reflecting members 26 can be disposed by using any appropriate method known in the art, such as a printing method, an ink jet method, and a spray method.

The light-reflecting members 26 can be disposed with a thickness, for example, in a range of 10 μm to 100 μm.

The light emitting device may further includes at least one selected from the group consisting of a wavelength-converting sheet, a prism sheet, and a polarizing sheet, configured to convert light from the light sources 11 into light of different wavelength, disposed on or above the light-diffusing plate 14. More specifically, as shown in FIG. 3B, optical members such as a wavelength-converting sheet 22, one or more prism sheets (a first prism sheet 23 and a second prism sheet 24), a polarizing sheet 25 may be disposed above the light-diffusing plate 14, directly or indirectly on the upper surface of the light-diffusing plate 14, or spaced apart from the light-diffusing plate 14 at a predetermined distance, and further, a liquid crystal panel may be disposed on or above the optical members such that a surface-emitting type light-emitting device for a light source for a direct-type backlight can be obtained. The sequences of the optical members disposed in layers can be appropriately determined.

Wavelength-Converting Sheet 22

The wavelength converting member or sheet 22 can be disposed on either the upper surface or the lower surface of the light-diffusing plate 14, but as shown in FIG. 3B, the wavelength-converting sheet 22 is preferably disposed on the upper surface of the light-diffusing plate 14. The wavelength-converting sheet 22 is configured to absorb a portion of light emitted from the light sources 11 and emit light having a wavelength different from the wavelength of light emitted from the light sources 11. For example, the wavelength-converting sheet 22 absorbs a portion of blue light emitted from the light sources 11 and emits yellow light, green light and/or red light, such that the light emitting device to emit white light can be obtained. The wavelength converting sheet 22 is located spaced apart from the light emitting elements of the light sources 11, allowing for use of a fluorescent material or the like, which is less resistant to heat and/or light of high intensity and cannot be used near the light emitting elements 15. Accordingly, when the light source device is used as a backlight of a light emitting device, performance as a backlight in a light emitting device can be improved.

The wavelength converting sheet 22 has a sheet shape or a layer shape, and includes the fluorescent material etc. described above.

First Prism Sheet 23 and Second Prism Sheet 24

The first prism sheet 23 and the second prism sheet 24 respectively has a surface provided with a plurality of prisms extending in a predetermined direction. For example, assuming the plane of the sheets a two-dimensional plane with an x-direction and a y-direction oriented at a right angle to the x-direction, the first prism sheet 23 may include a plurality of prisms extending in the y-direction and the second prism sheet 24 may include a plurality of prisms extending in the x-direction. The prism sheets are configured such that light incident on the prism sheet from different directions is reflected in a direction toward a display panel that is facing the light emitting device. Accordingly, light emitted from the light-emitting surface of the light emitting device can be directed mainly in an upward direction perpendicular to the upper surface of the light emitting device, such that the luminance viewed from the front of the light emitting device can be increased.

Polarizing Sheet 25

The polarizing sheet 25 can be configured, for example, to selectively transmit light traveling in the polarization direction of a polarization plate that is located at a backlight side of a display panel, for example, a liquid crystal display panel, and to reflect the polarized light traveling in a direction perpendicular to the polarization direction toward the first prism sheet 23 and the second prism sheet 24. Portions of light returned from the polarizing sheet 25 are reflected again at the first prism sheet 23, the second prism sheet 24, the wavelength converting sheet 22, and the light-diffusing plate 14. At this time, the polarization direction is changed and converted into, for example, polarized light in polarization direction of the polarization plate of a liquid crystal display panel, and the polarized light enters the polarizing sheet 25 again and emitted toward the display panel. Accordingly, the polarization directions of light emitted from the light emitting device can be aligned, such that light in the polarization direction effective for improving the luminance of the display panel can be emitted with high efficiency. The polarizing sheet 25, the first prism sheet 23, the second prism sheet 24, etc., that are commercially available as optical members for backlight can be employed.

The light emitting devices according to the embodiments of the present invention can be used in various light emitting devices such as backlight light source of display devices and light source of lighting applications.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
   a substrate having a plurality of light sources;
   a demarcating member including a plurality of wall parts defining a plurality of compartments respectively corresponding to the plurality of light sources with each of the plurality of light sources being surrounded by corresponding ones of the wall parts defining a single compartment, each of the wall parts including a ridge part and an inclined surface part; and
   a light-diffusing plate disposed above the plurality of light sources, and having
      a plurality of first protrusions disposed on a first surface of the light-diffusing plate facing the substrate, each of the first protrusions overlapping the inclined surface part of each of corresponding ones of the wall parts in a plan view, each of the first protrusions surrounding a corresponding one of the plurality of light sources in the plan view, and
      a plurality of second protrusions arranged on a first surface side of the light-diffusing plate facing the substrate, each of the second protrusions overlapping a corresponding one of the plurality of light sources in the plan view with an area of each of the second protrusions being greater than an area of the corresponding one of the plurality of light sources in the plan view.

2. The light emitting device according to claim 1, wherein each of the first protrusions has a thickness as measured from the first surface of the light-diffusing plate in a range of 10 to 30% with respect to a minimum thickness of the light-diffusing plate.

3. The light emitting device according to claim 1, wherein each of the first protrusions has a cross-sectional shape symmetrical along a longitudinal center line of the first protrusion.

4. The light emitting device according to claim 1, wherein each of the compartments has a quadrangular shape in the plan view, and each of the first protrusions has a quadrangular ring shape arranged in a corresponding one of the compartments in the plan view.

5. The light emitting device according to claim 1, wherein the inclined surface part has an upper inclined surface part and a lower inclined surface part having different inclination angles with the upper inclined surface part and the lower inclined surface part being arranged in an up-down direction, and each of the first protrusions overlapping the upper inclined surface part of the inclined surface part of each of the corresponding ones of the wall parts in the plan view.

6. The light emitting device according to claim 1, wherein a thickness of the light-diffusing plate at each of the second protrusions is in a range of 400 to 600% with respect to a minimum thickness of the light-diffusing plate.

7. The light emitting device according to claim 1, wherein each of the second protrusions has a maximum thickness directly above the corresponding one of the plurality of light sources.

8. The light emitting device according to claim 1, wherein each of the second protrusions has a cross-sectional shape symmetrical with respect to a line passing through a portion having the maximum thickness.

9. The light emitting device according to claim 1, further comprising
   a wavelength converting member disposed on a second surface side of the substrate opposite to the first surface of the light-diffusing plate, the wavelength converting member being light transmissive.

10. The light emitting device according to claim 1, wherein
    each of the first protrusions has a thickness as measured from the first surface of the light-diffusing plate in a range of 10 to 30% with respect to a minimum thickness of the light-diffusing plate.

11. The light emitting device according to claim 1, wherein
    each of the first protrusions has a cross-sectional shape symmetrical along a longitudinal center line of the first protrusion.

12. The light emitting device according to claim 1, wherein
    each of the compartments has a quadrangular shape in the plan view, and each of the first protrusions has a quadrangular ring shape arranged in a corresponding one of the compartments in the plan view.

13. The light emitting device according to claim 1, wherein
    a maximum thickness of the light-diffusing plate at each of the second protrusions is greater than a maximum thickness of the light-diffusing plate at each of the first protrusions.

14. The light emitting device according to claim 1, wherein
    a thickness of the light-diffusing plate at each of the second protrusions gradually decreases from a position directly above the corresponding one of the plurality of light sources toward a surrounding area of the corresponding one of the plurality of light sources.

15. A light emitting device comprising:
    a substrate having a plurality of light sources;
    a demarcating member including a plurality of wall parts defining a plurality of compartments respectively corresponding to the plurality of light sources with each of the plurality of light sources being surrounded by corresponding ones of the wall parts defining a single compartment, each of the wall parts including a ridge part and an inclined surface part; and
    a light-diffusing plate disposed above the plurality of light sources and having a plurality of first protrusions disposed on a first surface of the light-diffusing plate facing the substrate, each of the first protrusions is disposed only in an area overlapping the inclined surface part of each of corresponding ones of the wall parts in a plan view, each of the first protrusions surrounding a corresponding one of the plurality of light sources in the plan view.

16. The light emitting device according to claim 15, wherein
the first surface of the light-diffusing plate having a flat surface part surrounding each of the first protrusions.

* * * * *